United States Patent [19]

Aoyama et al.

[11] Patent Number: 5,854,572
[45] Date of Patent: Dec. 29, 1998

[54] COMPACT STRUCTURE OF AUTOMATIC GAIN CONTROL CIRCUIT

[75] Inventors: Seiki Aoyama, Toyohashi; Yasuaki Makino, Okazaki, both of Japan

[73] Assignee: Denso Corporation, Kariya, Japan

[21] Appl. No.: 867,743

[22] Filed: Jun. 3, 1997

[30] Foreign Application Priority Data

Jun. 4, 1996 [JP] Japan ................................. 8-141478

[51] Int. Cl.$^6$ .......................................................... H03G 3/20
[52] U.S. Cl. ................................................. 330/282; 330/86
[58] Field of Search ............................. 330/86, 129, 278, 330/279, 282, 284

[56] References Cited

U.S. PATENT DOCUMENTS

| 4,109,213 | 8/1978 | Holley et al. ...................... 330/86 X |
| 4,910,797 | 3/1990 | Min et al. .......................... 330/284 X |
| 5,245,229 | 9/1993 | Colvin ................................ 330/282 X |
| 5,493,219 | 2/1996 | Makino et al. ..................... 324/174 X |

FOREIGN PATENT DOCUMENTS

| 60-220611 | 11/1985 | Japan . |
| 61-242405 | 10/1986 | Japan . |
| 62-154808 | 7/1987 | Japan . |
| 62-235848 | 10/1987 | Japan . |
| 4-069986 | 3/1992 | Japan . |
| 4-369108 | 12/1992 | Japan . |
| 6-300584 | 10/1994 | Japan . |
| 7-028191 | 3/1995 | Japan . |

*Primary Examiner*—Steven Mottola
*Attorney, Agent, or Firm*—Pillsbury Madison & Sutro LLP

[57] ABSTRACT

An automatic gain control circuit for controlling the gain of an amplifier amplifying an ac signal is provided which includes a resistance circuit, a comparing circuit, a gain control determining circuit, and a gain controlling circuit. The resistance circuit includes a plurality of resistors connected in series through taps. The comparing circuit compares an output signal of the amplifier with reference upper and lower limit values to determine whether the output signal of the amplifier is within a desired amplitude range of the reference upper limit value to the reference lower limit value or not. The gain control determining circuit determines whether the output signal of the amplifier has exceeded the upper and lower limit values sequentially during a complete cycle thereof for determining whether the gain of the amplifier should be changed or not. The gain controlling circuit selectively short-circuits the taps on both sides of each of the resistors of the resistance circuit to change a total resistance of the resistance circuit for controlling the gain of the amplifier when the output signal of the amplifier has exceeded the upper and lower limit values sequentially.

4 Claims, 9 Drawing Sheets

FIG. 5

| NUMBER OF GAIN SWITCHING OPERATIONS | DECREASE IN RESISTANCE (KΩ) | | TOTAL RESISTANCE (KΩ) | SW ON RESISTANCE (KΩ) | GAIN | ATTENUATION PERCENTAGE |
|---|---|---|---|---|---|---|
| 0 | | | 100 | 0 | -100 | |
| 1 | R402 | -20 | 80 | 0.25 | -80.25 | 80% |
| 2 | R403 | -16 | 64 | 0.5 | -64.5 | 80% |
| 3 | R404 | -14 | 50 | 0.75 | -50.75 | 79% |
| 4 | R405 | -12 | 38 | 1 | -39 | 77% |
| 5 | R406 | -10 | 28 | 1.25 | -29.25 | 75% |
| 6 | R407 | -8 | 20 | 1.5 | -21.5 | 74% |
| 7 | R408 | -6 | 14 | 1.75 | -15.75 | 73% |
| 8 | R409 | -4 | 10 | 2 | -12 | 76% |
| 9 | R410 | -3 | 7 | 2.25 | -9.25 | 77% |
| 10 | R411 | -2.4 | 4.6 | 2.5 | -7.1 | 77% |
| 11 | R412 | -2.0 | 2.6 | 2.75 | -5.35 | 75% |
| 12 | R413 | -1.6 | 1 | 3 | -4 | 75% |

5,854,572

COMPACT STRUCTURE OF AUTOMATIC GAIN CONTROL CIRCUIT

BACKGROUND OF THE INVENTION

1. Technical Field

The present invention relates generally to an automatic gain control circuit, and more particularly to a compact structure of an automatic gain control circuit designed to maintain the amplitude of an output of a semiconductor sensor increased by an amplifier at a constant level by controlling the gain of the amplifier.

2. Background of Related Art

An automatic gain control circuit is used in, for example, a sensor signal processing circuit which amplifies a sensor signal outputted from a gear speed sensor and compares it with a reference voltage level to produce a binary-coded pulse signal indicating the speed of a gear. The gear speed sensor uses a magnetoresistive element oriented toward magnetic teeth of the gear to detect a change in resistance of the magnetoresistive element due to passage of each tooth of the gear and converts it into a rectangular signal or a sine wave signal according to the shape of the teeth of the gear. The automatic gain control circuit adjusts the degree to which the output signal from the gear speed sensor is amplified by an amplifier.

If the distance between the gear and the gear speed sensor is great due to an assembling error of the gear speed sensor, the output signal from the gear speed sensor will show a micro amplitude. The automatic gain control circuit automatically increases the amplification factor of the amplifier so that the output signal from the gear speed sensor can be compared with the reference voltage level.

As such an automatic gain control circuit, Japanese Patent First Publication No. 61-242405 and Japanese Patent Second Publication No. 7-28191 teach an multi-resistance switching circuit which has a plurality of resistors having different resistances, connected in parallel and switches them to change the amplification factor of an amplifier. Further, Japanese Patent First Publication No. 4-369108 teaches an ON-resistance switching circuit which is designed to change the amplification factor of an amplifier by changing the voltage at a gate of a transistor to modify an ON-resistance of the transistor.

The above multi-resistance switching circuit has, however, the drawback in that the use of many resistors results in an increased size of the circuit. Another problem is also encountered in that some of the resistors may be turned on or off simultaneously, thereby resulting in a great change in resistance.

The above ON-resistance switching circuit has the drawback in that the ON-resistance is changed by the voltage across a source and a drain of the transistor, thereby leading to distortion of a waveform of a signal after amplified. The temperature characteristic is also low which will cause the accuracy in processing the waveform of the signal in a following circuit to be degraded.

SUMMARY OF THE INVENTION

It is therefore a principal object of the present invention to avoid the disadvantages of the prior art.

It is another object of the present invention to provide an automatic gain control circuit for an amplifier which has a compact resistance circuit structure designed to adjust the amplification factor of the amplifier accurately.

According to one aspect of the present invention, there is provided an automatic gain control apparatus for controlling gain of an amplifier amplifying an ac signal which comprises: (a) a resistance circuit including a plurality of resistors connected in series through taps, designed to adjust the gain of the amplifier; (b) a comparing circuit comparing an output signal of the amplifier with reference upper and lower limit values to provide an upper limit signal when the output signal of the amplifier exceeds the reference upper limit value and a lower limit signal when the output signal exceeds the reference lower limit value; (c) a gain control determining circuit determining whether said comparing circuit has provided the upper limit signal and the lower limit signal sequentially or not for determining whether the gain of the amplifier is to be changed or not; and (d) a gain controlling circuit selectively short-circuiting the taps on both sides of each of the resistors of said resistance circuit to change a total resistance of said resistance circuit for controlling the gain of the amplifier based on determination of said gain control determining circuit.

In the preferred mode of the invention, said gain controlling circuit establishes short-circuits of the taps of the resistors in sequence to change the total resistance of said resistance circuit so that the gain of the amplifier is decreased from a maximum value to a desired value.

The gain controlling circuit includes a switching circuit which establishes direct communication between the taps on both sides of each of the resistors of said resistance circuit to short-circuit the taps.

The gain controlling circuit may alternatively establish shortcircuits of the taps of the resistors in sequence to change the total resistance of said resistance circuit so that the gain of the amplifier is increased from a minimum value to a desired value.

BRIEF DESCRIPTION OF THE DRAWINGS

The present invention will be understood more fully from the detailed description given hereinbelow and from the accompanying drawings of the preferred embodiment of the invention, which, however, should not be taken to limit the invention to the specific embodiment but are for explanation and understanding only.

In the drawings:

FIG. 4(*b*) is a time chart which shows a comparison signal INO outputted from a comparator 4;

FIG. 4(*c*) is a time chart which shows an upper limit signal CMP/U outputted from an upper limit comparator 7;

FIG. 4(*d*) is a time chart which shows a lower limit signal CMP/D outputted from a lower limit comparator 8;

FIG. 4(*e*) is a time chart which shows an output signal Q1 of a D flip-flop 15;

FIG. 4(*f*) is a time chart which shows a reset signal R1 outputted from an inverter 19;

FIG. 4(*g*) is a time chart which shows an output signal Q2 of a D flip-flop 20;

FIG. 4(*h*) is a time chart which shows a reset signal R2 outputted from an inverter 14;

FIG. 4(i) is a time chart which shows a logical product CLK (Q1 ×Q2) provided by an NAND circuit 21;

FIG. 5 is a table which shows the relation between the gain of an amplifier 3 and the number of gain switching operations;

DESCRIPTION OF THE PREFERRED EMBODIMENT

Figure 1:
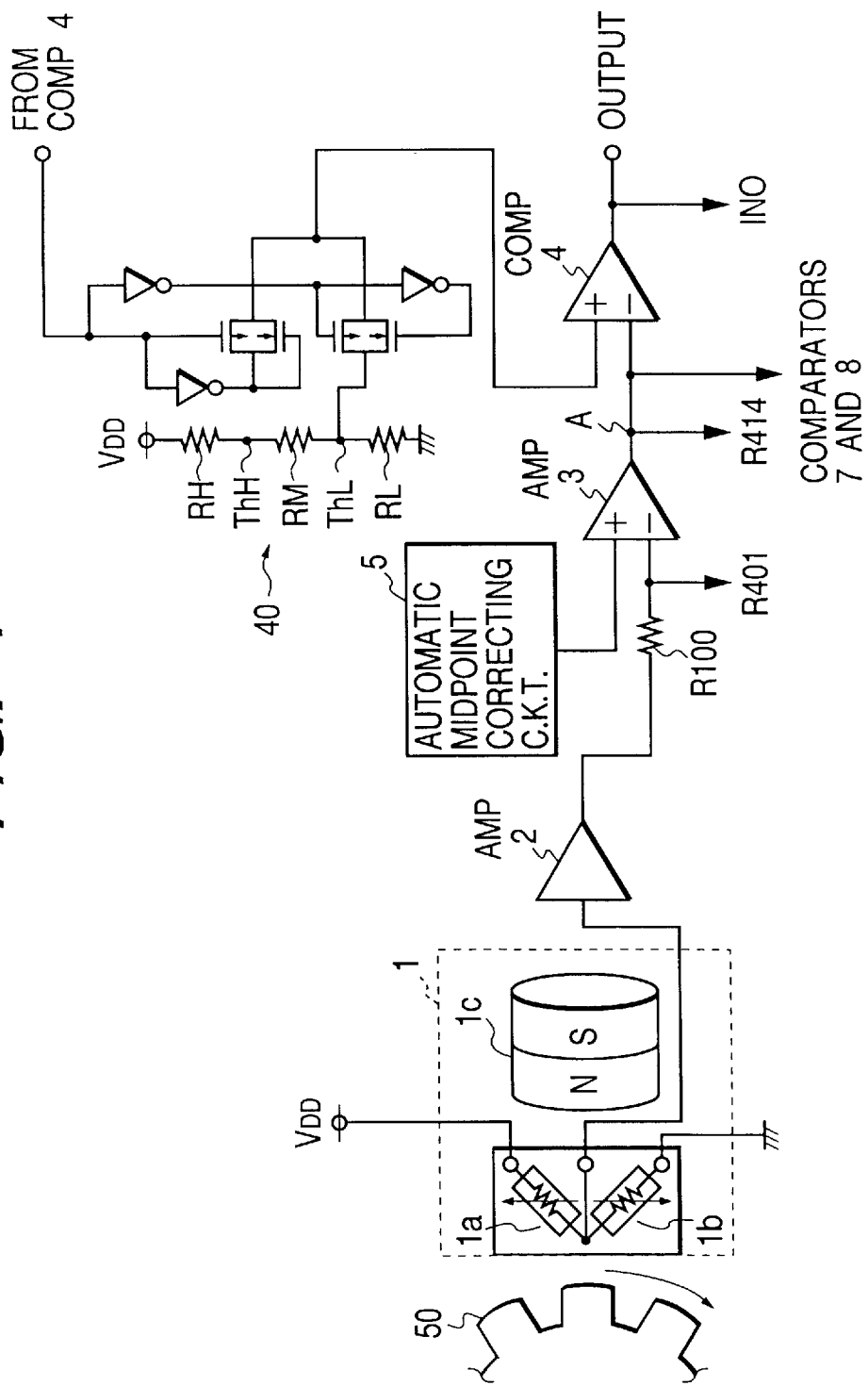
FIG. 1 is a circuit diagram which shows a sensor signal processing circuit using an automatic gain control circuit according to the present invention.
Figure 2:
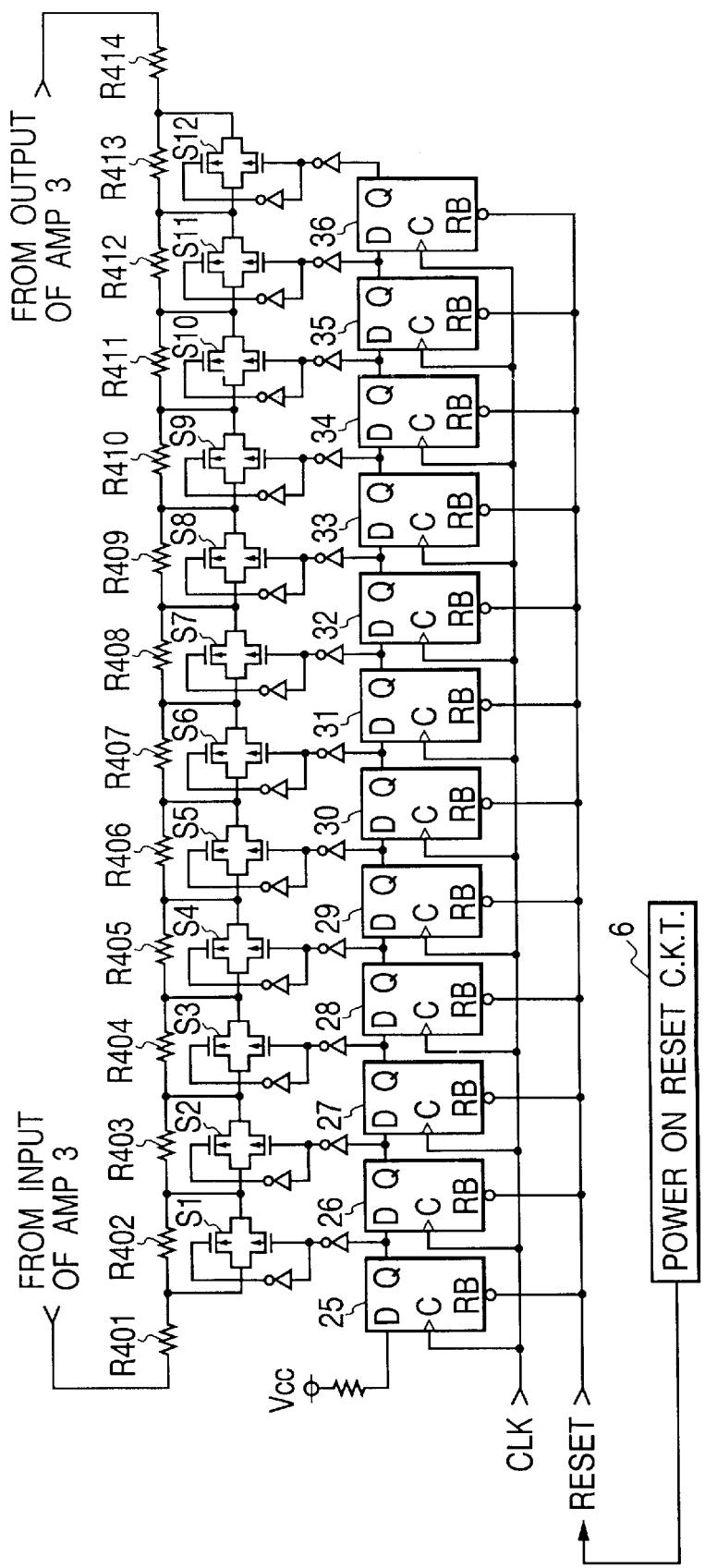
FIG. 2 is a circuit diagram which shows a gain switching circuit according to the first embodiment of the invention.
Figure 3:
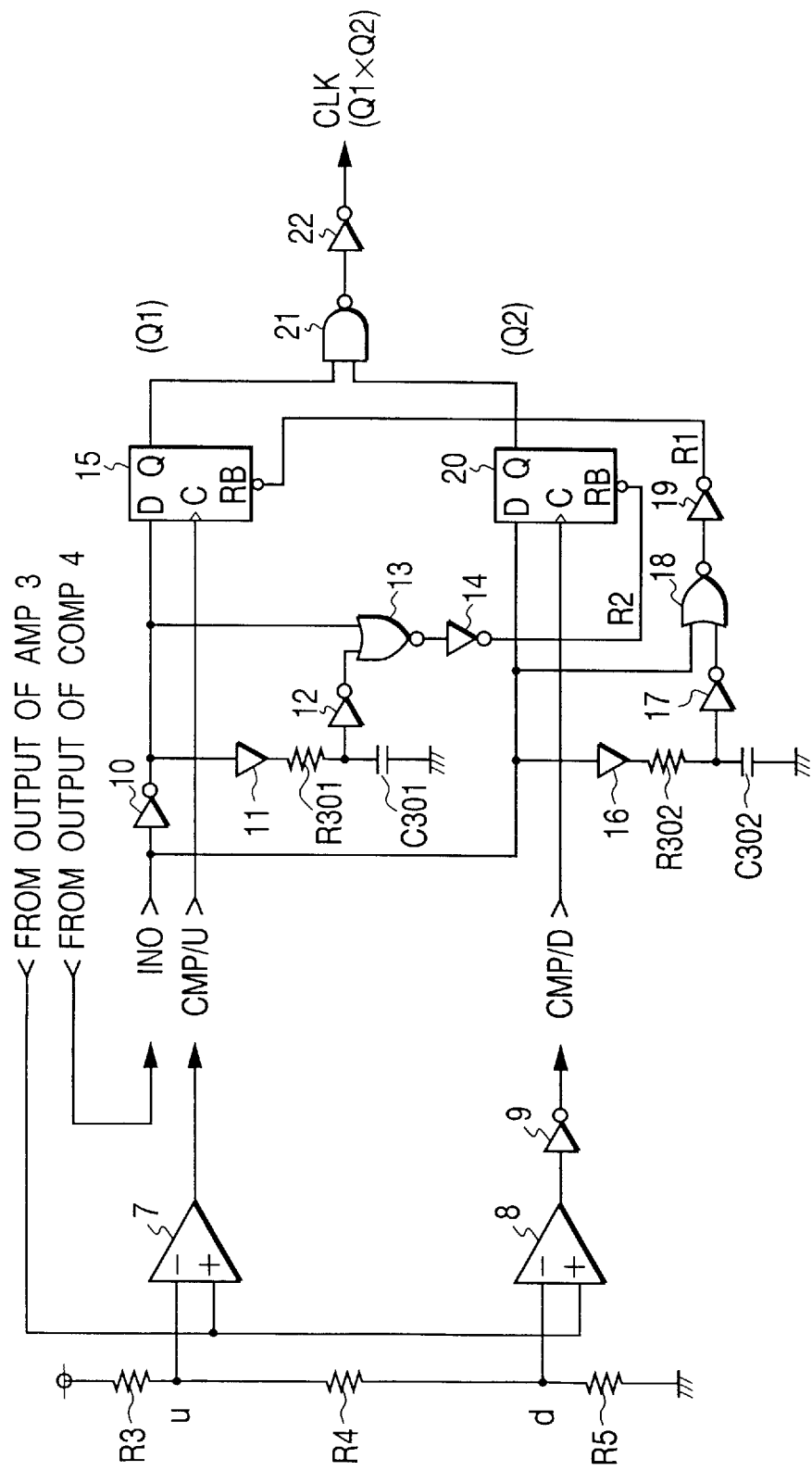
FIG. 3 is a circuit diagram which shows an automatic gain control circuit according to the first embodiment of the invention.

Referring now to the drawings, particularly to FIGS. 1 to 3, there is shown a sensor signal processing circuit using an automatic gain control circuit of the invention.

The sensor signal processing circuit includes a magnetoresistive sensor 1, amplifiers 2 and 3, a comparator 4, an automatic midpoint correcting circuit 5, a reference voltage generator 40, and a resistor R100.

The magnetoresistive sensor 1 includes a magnet 1c and a pair of magnetoresistive elements 1a and 1b oriented at given angles toward teeth of a gear 50 through a preselected air gap. When a magnetic field produced by the magnet 1c is changed in direction due to rotation of the gear 50, the magnetoresistive elements 1a and 1b detect it to provide a sensor signal indicative thereof in the form of an ac signal to the amplifier 2.

The amplifier 2 amplifies the sensor signal from the magnetoresistive sensor 1 by an amplification factor of ten (10) and outputs it to an inverting input terminal (−) of the amplifier 3.

The amplifier 3 receives at a non-inverting input (+) a correcting voltage from the automatic midpoint correcting circuit 5 and at an inverting input terminal (−) the sensor signal (hereinafter, also referred to as a preamplifier output) outputted from the amplifier 2 through the resistor R100. The amplifier 3 provides an output under feedback control through gain control resistors R401 to R414, as shown in FIG. 2, to an inverting input terminal (−) of the comparator 4. An initial gain of the amplifier 3 is set to, for example, −100(−{R401+R402+. . . +R414}/R100). The amplifier 3 uses 5 V as a source voltage VDD and provides an output (hereinafter, also referred to as a main amplifier output) within a voltage range of a lower limit of 0 V to an upper limit of 4 V. The amplifier 3 is connected at an output terminal to non-inverting input terminals (+) of an upper limit comparator 7 and a lower limit comparator 8 as shown in FIG. 3.

The comparator 4 receives at the inverting input terminal (−) the main amplifier output of the amplifier 3 and at the non-inverting input terminal (+) a reference voltage ThH or ThL produced by dividing the source voltage VDD using resistors RH, RM, and RL and compares one of the reference voltages ThH and ThL with a voltage level of the main amplifier output to provide comparison signals INO in the form of digital signals to an external device through an output terminal and an input terminal of an inverter 10 as shown in FIG. 3. The reference voltages ThH and ThL are selected by a switching circuit consisting of inverters and analog switches based on the comparison signal INO from the comparator 4.

Figure 4:
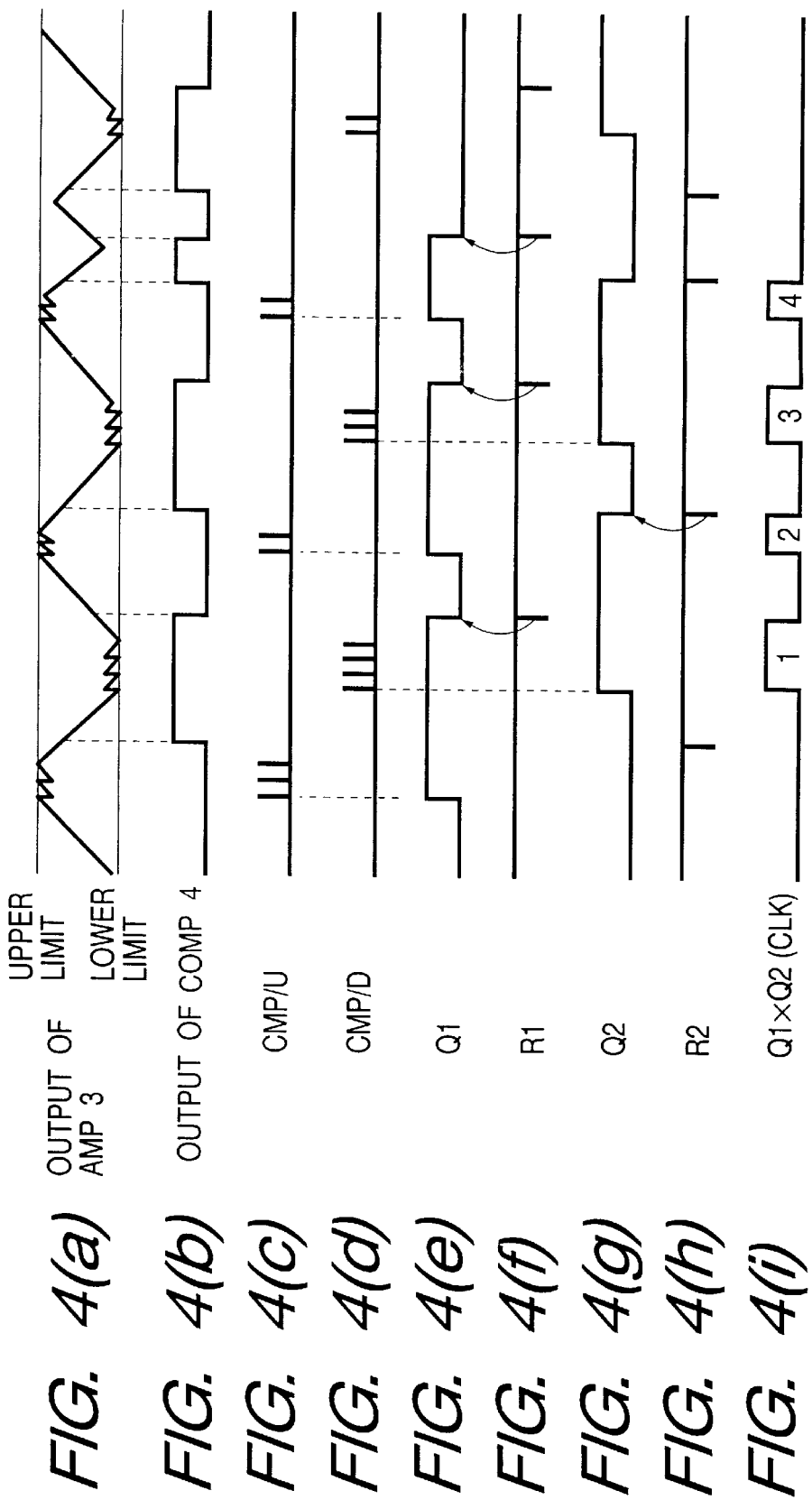
FIG. 4(*a*) is a time chart which shows an output of an amplifier 3 appearing at a junction A in FIG. 1.

The automatic midpoint correcting circuit 5 provides a correcting voltage to the non-inverting input terminal (+) of the amplifier 3 so that the main amplifier output of the amplifier 3 may fall within the voltage range from 0 V to 4 V that are fractions of the source voltage VDD and developed at taps u and d between the resistors R3 and R4 and between the resistors R4 and R5 as shown in FIG. 4. The correcting voltage is produced by multiplying a given value determined by the direction of voltage correction by a gain each time it exceeds either of the upper and lower voltage limits appearing at the taps u and d.

FIG. 2 shows a gain switching circuit which includes gain control resistors R401 to R414, analog switching circuits S1 to S12, shift registers 25 to 36 turning on and off the analog switching circuits S1 to S12, and a power-on reset circuit 6.

The control resistors R401 to R414 are, as clearly shown in FIG. 2, arranged in series and connected at taps thereof to the analog switching circuits S1 to S12, respectively. A total resistance of the resistors R401 to R414 is adjusted by turning on and off the switching circuits S1 to S12 through the shift registers 25 to 36.

Each of the analog switching circuits S1 to S12 includes a CMOS transistor and two inverters and is turned on to establish short-circuit of the taps on both sides of one of the gain control resistors R402 and R413 when a PMOS transistor connected at a gate to first one of the inverters and an NMOS transistor connected at a gate to second one of the inverters are both turned on in response to change of a signal outputted from an output terminal Q of one of the shift registers 25 to 36 to a high-level.

The shift registers 25 to 36 are connected at an output terminal Q to a D input terminal of adjacent one and receive a common clock signal CLK at a clock input terminal C. The shift registers 25 to 36 are also connected at the output terminals Q to the inverters of the analog switching circuits S1 to S12 for turning on and off them in sequence. The shift register 25 is applied at the input terminal D with the source voltage VDD, outputs the high-level signal from the output terminal Q thereof to the input terminal D of the shift register 26 in response to input of first one of the clock signals CLK, and turns on the analog switching circuit S1 to short-circuit both ends of the resistor R402.

The shift register 26 is responsive to input of second one of the clock signals CLK to output the high-level signal from the output terminal Q thereof to the input terminal D of the shift register 27 and turns on the analog switching circuit S2 to short-circuit both ends of the resistor R403. Similarly, the shift registers 27 to 36 are responsive to the clock signals CLK, in sequence, to turn on the switching circuits S3 to S12 so that ends of the resistors R404 to R414 are short-circuited, respectively.

The shift registers 25 to 36 are also responsive to reset signals RESET inputted to reset terminals RB thereof from the power on reset circuit 6 to reset data stored therein when the sensor signal processing circuit is turned on and output low-level signals from the Q output terminals, respectively. This causes the analog switching circuits S1 to S12 to be all turned off so that the gain determined by the resistors R401 and R414 shows a maximum value.

The power-on reset circuit 6 is connected at an output terminal thereof to reset terminals RB of the shift registers 25 to 36 and outputs reset signals RESET to the shift registers 25 to 36 when the sensor signal processing circuit is turned on.

FIG. 3 shows the automatic gain control circuit which includes a first reset signal generator, a second reset signal generator, an AND circuit, and voltage divider resistors R3 to R5. The first reset signal generator generates a reset signal R1 and consists of a buffer 16, an inverter 17, a NOR circuit 18, an inverter 19, a resistor R302, and a capacitor C302. The second reset signal generator generates a reset signal R1 and consists of the upper limit comparator 7, the lower limit comparator 8, inverters 10 and 14, a buffer 11, an inverter 12, a NOR circuit 13, a resistor R301, and a capacitor C301. The AND circuit consists of a MAND circuit 21 and an inverter 22.

The reset signals R1 and R2 are provided using time constants of R-C circuits consisting of the resistor R302 and the capacitor C302 and the resistor R301 and the capacitor R301, respectively.

The upper limit comparator 7 receives at an inverting input terminal (−) thereof an upper limit reference voltage developed at the tap u that is a fraction of the source voltage VDD and at a non-inverting input terminal (+) the main amplifier output from the amplifier 3 shown in FIG. 1 to compare them to produce an upper limit signal CMP/U in the form of a clock pulse to a clock input terminal C of a D flip-flop 15 when the main amplifier output is greater than or equal to the upper limit reference voltage.

The lower limit comparator 8 receives at an inverting input terminal (−) thereof a lower limit reference voltage developed at the tap d and at a non-inverting input terminal (+) the main amplifier output of the amplifier 3 to compare them to produce a lower limit signal CMP/D in the form of a clock pulse to a clock input terminal C of a D flip-flop 20 when the main amplifier output is smaller than or equal to the lower limit reference voltage.

The D flip-flop 15 receives at a data input terminal D the comparison signal INO outputted from the comparator 4 which is inverted in level by the inverter 10, at the clock input terminal C the upper limit signal CMP/U from the upper limit comparator 7, and at the reset terminal RB the reset signal Ri from the inverter 19 of the first reset signal generator. The D flip-flop 15 holds the reverse of the comparison signal INO inputted from the inverter 10 in response to the clock pulse (i.e., the upper limit signal CMP/U) from the upper limit comparator 7 and provides an output signal Q1 from the output terminal Q to the input terminal of the NAND circuit 21. The holding of the reverse of the comparison signal INO is released in response to input of the reset signal R1.

The D flip-flop 20 receives at a data input terminal D the comparison signal INO outputted from the comparator 4, at the clock input terminal C the lower limit signal CMP/D derived by inverting in level the output of the lower limit comparator 8 through the inverter 9, and at the reset terminal RB the reset signal R2 from the inverter 14 of the second reset signal generator. The D flip-flop 20 holds the comparison signal INO in response to the clock pulse (i.e., the lower limit signal CMP/D) from the lower limit comparator 8 and provides an output signal Q2 from the output terminal Q to the input terminal of the NAND circuit 21. The holding of the comparison signal INO is released in response to input of the reset signal R2.

The AND circuit provides a logical product (Q1×Q2) of the output signals Q1 and Q2 inputted to the NAND circuit 21 from the D flip-flops 15 and 20 to the reset terminal RB of each of the shift registers 25 to 36.

The operation of the sensor signal processing circuit will be discussed below with reference to time charts in FIGS. 4(a) to 4(i).

FIG. 4(a) shows the main amplifier output of the amplifier 3 appearing at a junction A in FIG. 1. FIG. 4(b) shows the comparison signal INO outputted from the comparator 4. FIG. 4(c) shows the upper limit signal CMP/U outputted from the upper limit comparator 7. FIG. 4(d) shows the lower limit signal CMP/D outputted from the lower limit comparator 8 through the inverter 9.

FIG. 4(e) shows the output signal Q1 of the D flip-flop 15. FIG. 4(f) shows the reset signal R1 outputted from the inverter 19. FIG. 4(g) shows the output signal Q2 of the D flip-flop 20. FIG. 4(h) shows the reset signal R2 outputted from the inverter 14. FIG. 4(i) shows the logical product CLK (Q1×Q2) provided by the NAND circuit 21.

In an initial state of the sensor signal processing circuit immediately after turned on, each of the shift registers 25 to 36 receives the reset signal RESET from the power-on reset circuit 6 to provide the output signal at the output terminal Q showing a lower level, thereby turning off all the analog switching circuits S1 to S12. The gain provided by the resistors R401 to R414, thus, shows a maximum value (−100) as expressed by the equation (1) below.

$$-(R401+R402+\ldots+R414)/R100 \qquad (1)$$

When the gear 50 starts to rotate, a sensor signal is produced in the form of a sine wave at a central terminal between the magnetoresistive elements 1a and 1b of the magnetoresistive sensor 1 connected in series. The sensor signal is then amplified by the amplifiers 2 and 3 and provided as the main amplifier signal as schematically shown in FIG. 4(a).

Specifically, the sensor signal outputted from the central terminal of the magnetoresistive elements 1a and 1b may vary in amplitude within a range of 2.8 mV to 50.8 mV due to an installation error of the magnetoresistive sensor 1 and/or variations in sensitivity of the magnetoresistive elements 1a and 1b caused by a variation in ambient temperature, but this variation in amplitude is small, and the sensor signal is first amplified at the amplifier 2 by ten times which is, in turn, inputted to the inverting input terminal (−) of the amplifier 3 as the preamplifier output signal.

The preamplifier output signal is amplified by the amplifier 3 with the maximum gain provided in the initial state of the sensor signal processing circuit and outputted as the main amplifier output as shown in FIG. 4(a).

The main amplifier output then enters the automatic gain control circuit in FIG. 3. The upper limit comparator 7 compares the main amplifier output with the upper limit reference voltage (=2.9 V) developed at the tap u between the resistors R3 and R4. When the main amplifier output exceeds in level the upper limit reference voltage, the upper limit comparator 7 outputs the upper limit signal CMP/U of a high level, as shown in FIG. 4(c), as the clock pulse inputted to the D flip-flop 15. The D flip-flop 15 then holds the reverse of the comparison signal INO outputted from the comparator 4 and outputs the output signal Q1 from the output terminal Q as shown in FIG. 4(e).

Although not illustrated in FIGS. 4(a) to 4(i), the automatic midpoint correcting circuit 5 is actuated simultaneously with the above operations. Specifically, the automatic midpoint correcting circuit 5 corrects the voltage level inputted to the non-inverting input terminal of the amplifier 3 when the main amplifier output exceeds the upper limit reference voltage so as to decrease in level the main amplifier output below the upper limit reference voltage.

The D flip-flop 15 produces, as shown in FIG. 4(*e*), the output signal Q1 of a high level until the comparison signal INO of the comparator 4 falls in level as shown in FIG. 4(*b*). Specifically, the inverter 19 is responsive to the trailing edge of the comparison signal INO to provide the reset signal R1, as shown in FIG. 4(*f*), to the reset terminal RB of the D flip-flop 15. The D flip-flop 15 then provides the output signal Q1 of a lower level.

When the main amplifier output of the amplifier 3 decreases in level according to rotation of the gear 50, it is compared in the lower limit comparator 8 with the lower limit reference voltage (=0.3 V) developed at the tap d between the resistors 4 and 5. When the main amplifier output is decreased below the lower limit reference voltage, the lower limit comparator 8 provides the lower limit signal CMP/D of a high level through the inverter 9 as shown in FIG. 4(*d*). The lower limit signal CMP/D is inputted as the clock pulse to the D flop-flop 20 so that the comparison signal INO from the comparator 4 is held at the high level and outputted as the output signal Q2 as shown in FIG. 4(*g*).

When the main amplifier output decreases below the lower limit reference voltage, the automatic midpoint correcting circuit 5 is actuated to correct the voltage level inputted to the non-inverting input terminal of the amplifier 3 to increase in level the main amplifier output above the lower limit reference voltage.

The D flip-flop 20 produces, as shown in FIG. 4(*g*), the output signal Q2 of the high level until the comparison signal INO of the comparator 4 next rises in level as shown in FIG. 4(*b*). Specifically, the inverter 14 provides the reset signal R2, as shown in FIG. 4(*h*), to the reset terminal RB of the D flip-flop 20 upon a following rise in edge of the comparison signal INO. The D flip-flop 20 then provides the output signal Q2 of a lower level.

The output signals Q1 and Q2 of the D flip-flops 15 and 20 are inputted to the AND circuit consisting of the NAND circuit 21 and the inverter 22 to provide, as shown in FIG. 4(*i*), the logical product thereof (Q1×Q2) as the clock signal CLK to the clock terminal C of each of the shift registers 25 to 36.

The clock signal CLK is, as clearly shown in FIG. 4(*i*), produced each time the output signals Q1 and Q2 of the D flip-flops 15 and 20 show the high level at the same time. The shift registers 25 to 36 are responsive to the clock signals CLK, in sequence, to turn on the analog switching circuits S1 to S12. The analog switching circuits S1 to S12 then short-circuit the taps of the resistors R402 to R413, respectively, to change the gain of the amplifier 3. In the time chart of FIG. 4(*i*), the four clock signals CLK are produced, and thus the shift registers 25 to 28 produce the high level signals at the output terminals Q in sequence, thereby turning on the analog switching circuits S1 to S4 to short-circuit the taps of the resistors R402 to R405.

Specifically, when the main amplifier output from the amplifier 3 exceeds the upper and lower limit reference voltages sequentially during one cycle of change in level of the comparison signal INO (i.e., high-low-high or low-high-low), it is determined that the amplitude of the main amplifier output of the amplifier 3 is greater than the reference voltage difference (the upper limit reference voltage of 2.9 V –the lower limit reference voltage of 2.6 V), and the clock signal CLK (Q1×Q2) is outputted from the AND circuit or the inverter 22 for adjustment of the gain of the amplifier 3. The clock signals CLK are outputted sequentially until the amplitude of the main amplifier output falls within the range of 2.9 V to 0.3 V.

The adjustment of the gain of the amplifier 3 will be described below using mathematical formulas.

For example, turning on of the analog switching circuit S1 causes the current flow to be changed from the resistor R402 to the analog switching circuit S1, so that a feedback resistance of the amplifier 3 may be viewed as being decreased by a resistance value of the resistor R402. The gain of the amplifier 3 is thus given by the equation (2) below.

$$-\{(R401+R402+\ldots+R414)-R402\}/R100 \quad (2)$$

Specifically, the gain of the amplifier 3 may be expressed as follows:

$-\{$(initial gain)$-$(sum of resistance values of some of the resistors $R410$ to $R414$ short-circuited by some of the switching circuits $S1$ to $S12$ which are turned on)$\}/R100$ (3)

For example, when the analog switching circuits S1 to S12 are all turned on, the gain of the amplifier 3 is $$-(R401+R414)/R100 \quad (4)$$

Figure 6:
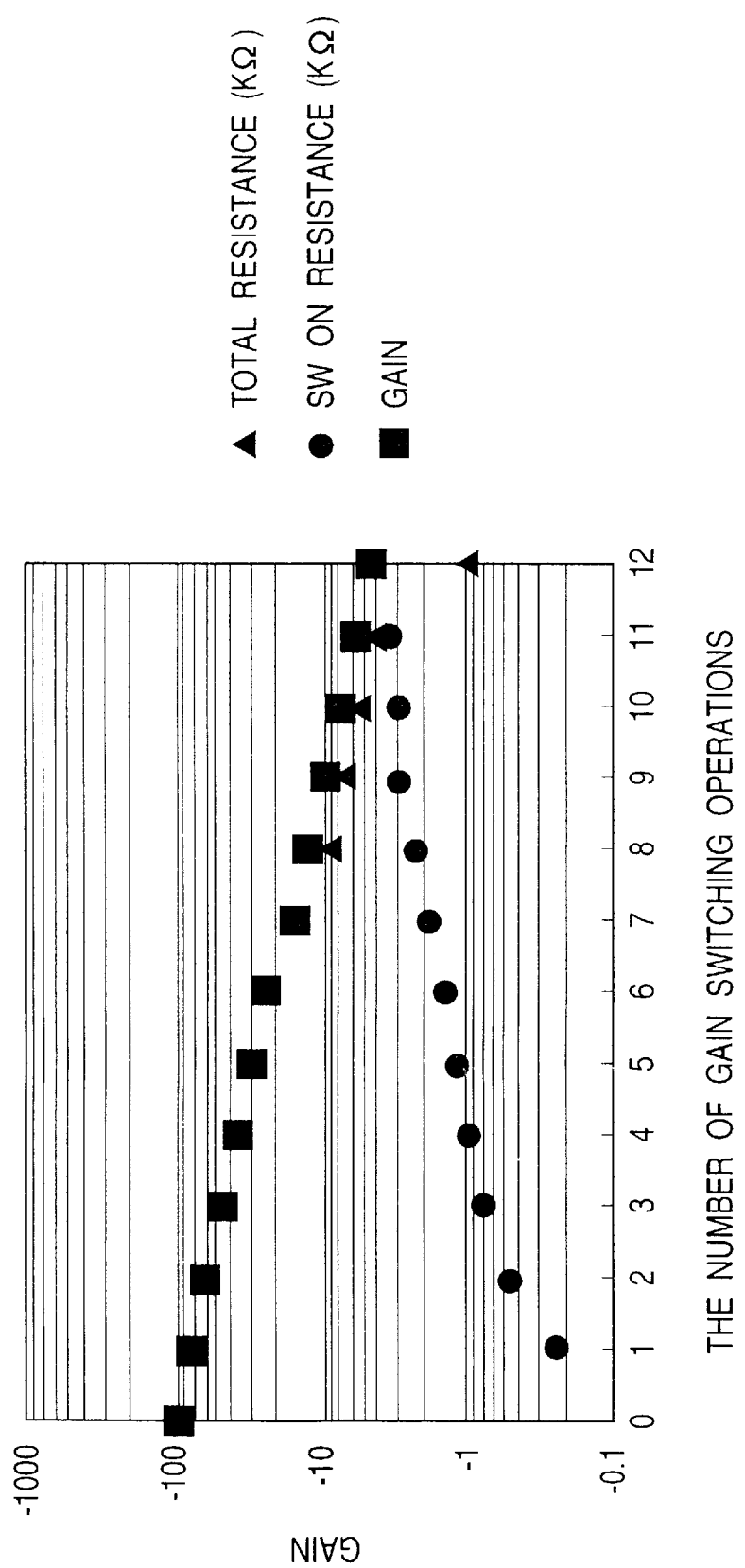
FIG. 6 is a graph which shows the relation between the gain of an amplifier 3 and the number of gain switching operations.

FIGS. 5 and 6 show the relation between the gain of the amplifier 3 and the number of gain switching operations. As will be apparent from the table and graph in FIGS. 5 and 6, the attenuation percentage of the output of the amplifier 3 is determined by a gain variable range and the number of gain switching operations. For example, if the gain of the amplifier 3 varies from –100 to –4, and the total number of gain switching operations is 12, it is advisable that the attenuation percentage ranges from 80% to 70%. These gain adjustment conditions are determined based on a variation in level of the sensor signal outputted from the magnetoresistive sensor 1 due to variations in air gap to the gear 50 and/or ambient temperature.

Figures 7A, 7B:
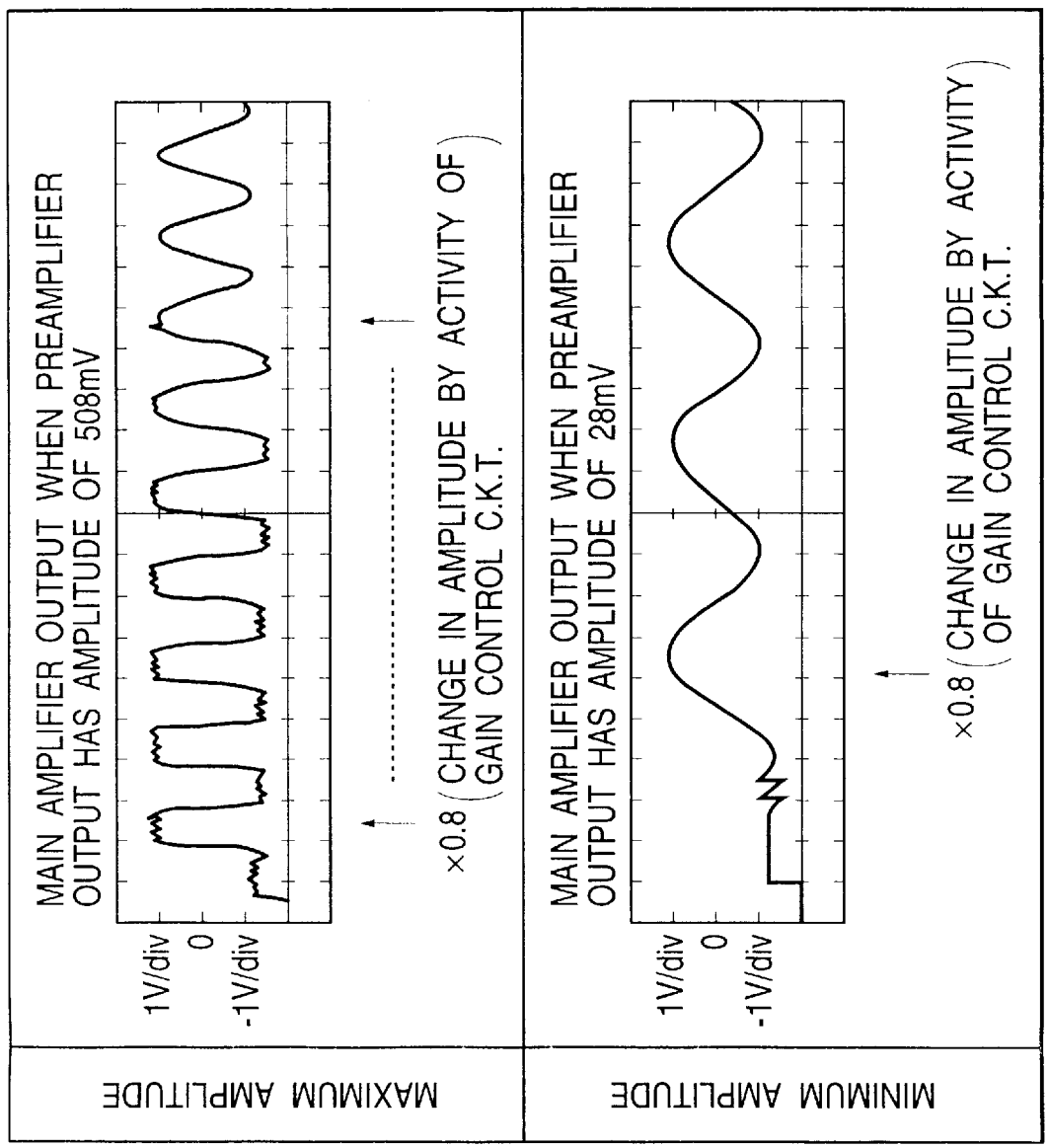
FIG. 7(a) shows the waveform of an output of an amplifier 3 changed by adjusting the gain of the amplifier 3 when an output of an amplifier 2 has a maximum amplitude.
FIG. 7(b) shows the waveform of an output of an amplifier 3 changed by adjusting the gain of the amplifier 3 when an output of an amplifier 2 has a minimum amplitude.

FIGS. 7(*a*) and 7(*b*) show signal waveforms of the output of the amplifier 3 changed by adjusting the gain of the amplifier 3 when the output of the amplifier 2 has a maximum amplitude (508 mV) and a minimum amplitude (28 mV). As clearly shown in the drawings, an amplitude of about 2 V appears when the output of the amplifier 2 shows either of the maximum and minimum amplitudes.

Specifically, the sensor signal outputted from the magnetoresistive sensor 1 is first amplified by the amplifier 2. The output of the amplifier 2 is, as already discussed using FIGS. 4(*a*) to 4(*i*), also amplified by the amplifier 3 to produce the main amplifier output that is a function of the difference between the output of the amplifier 2 and the output voltage of the automatic midpoint correcting circuit 5. The upper and lower limit comparators 7 and 8 determine whether the main amplifier output of the amplifier 3 lies within the amplitude range from the upper limit reference voltage to the lower limit reference voltage (i.e., 2.9–0.3=2.6 V) or not. If the main amplifier output exceeds the upper and lower limit reference voltages of the amplitude range sequentially during one cycle of output of the comparator 4, the D flip-flops 15 and 20 produce the upper and lower limit signals CMP/U and CMP/D having the high level simultaneously. This causes the AND circuit to output from the inverter 22 the clock signal CLK to the shift registers 25 to 36.

The shift registers 25 and 36 are responsive, in sequence, to the clock signals CLK to turn on the switching circuits S1 to S12, thereby causing the feedback resistance of the amplifier 3 to be decreased, so that the amplitude of the main amplifier output is attenuated.

The amplitude of the main amplifier output continues to be attenuated until it falls within the amplitude range from the upper limit reference voltage to the lower limit reference voltage, thereby resulting in stability of the amplitude of the main amplifier output.

The comparator 4 changes the output thereof from the lower level to the high level when the main amplifier output increases above the reference voltage and from the high level to the lower level when the main amplifier output decreases below the reference voltage, so that it produces a binary-coded pulse signal having sharp edges. This realizes the sensor signal processing circuit capable of measuring the speed of the gear 50 accurately.

The fine adjustment of the gain of the amplifier 3 is accomplished by short-circuiting the taps on both sides of each of the resistors R402 to R413 of the automatic gain control circuit, as shown in FIG. 2, connected in series along with the resistors R401 and 414 when the output of the amplifier 3 exceeds the upper and lower limit reference voltages.

The use of the resistors R401 to R414 connected in series for adjustment of the gain of the amplifier 3 decreases an occupied area of a circuit board, thereby allowing the overall structure of the sensor signal processing circuit to be reduced in size. This also results in a decrease in manufacturing cost of the sensor signal processing circuit.

The use of the analog switching circuits S1 to S12 each establishing direct communication between the taps on both sides of one of the resistors R402 to R413 and the shift registers 25 to 36 turning on and off the analog switching circuits S1 to S12 sequentially avoids instability of timing with which all the switching circuits S1 to S12 are opened and output of the amplifier 3 due to unwanted simultaneous turning on of some of the analog switching circuits S1 to S12 which would occur in a conventional system having analog switching circuits connected in parallel. This also ensures a stable operation of the automatic gain control circuit.

The use of the analog switching circuits S1 to S12 also avoids distortion of an output signal of the amplifier 3 which would occur in gain adjustment using turning on resistances of transistors in a conventional system, thereby resulting in improved accuracy of an operation of the comparator 4.

The gain switching circuit and the automatic gain control circuit in the above embodiment set the gain of the amplifier 3 to a maximum value of 100 initially and decrease it for adjusting the amplitude of output of the amplifier 3 into a desired range, but a reverse operation may be performed wherein the adjustment of the amplitude of output of the amplifier 3 is achieved by turning on all the analog switching circuits S1 to S12 first and turning off them in sequence to increase the gain of the amplifier 3 from a minimum value to a desired value. This may be realized by circuit arrangements as shown in FIGS. 8(a) and 8(b).

Figure 8A:
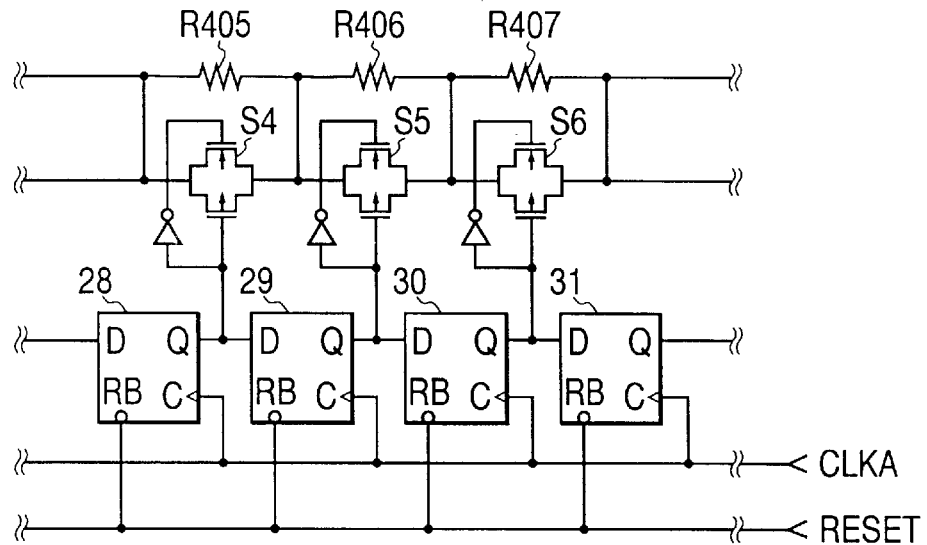
FIG. 8(a) is a circuit diagram which shows a gain switching circuit according to the second embodiment of the invention.

In a gain switching circuit shown in FIG. 8(a), the connection of a terminal Q of each of the shift registers 25 to 36 (only the shift registers 28 to 31 are shown for the sake of simplicity of illustration) to a terminal D of adjacent one is reverse to that shown in FIG. 2. Specifically, an output of the terminal D is inputted to the terminal Q of following one of the shift registers 25 to 36. One inverter is connected to each of the switching circuit S1 to S12 (only the switching circuits S4 to S6 are shown for the sake of simplicity of illustration), but three inverters may alternatively be used in each of the switching circuits S1 to S12. The shift registers 25 to 36 are turned on and off in the order reverse to that of the gain switching circuit shown in FIG. 2 (i.e., 31 to 28).

Figure 8B:
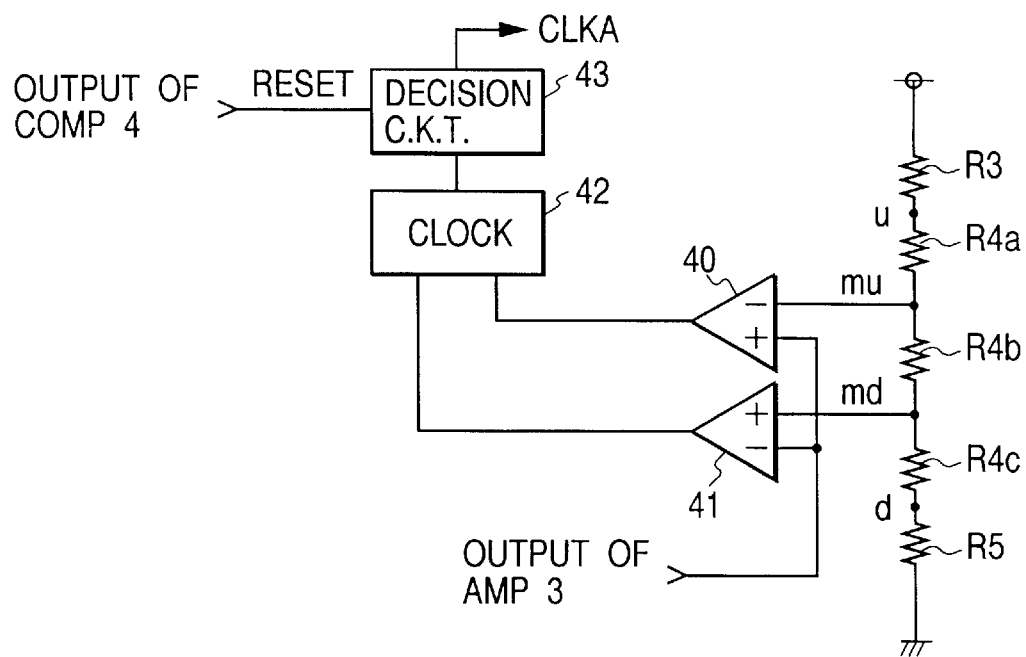
FIG. 8(b) is a circuit diagram which shows an automatic gain control circuit according to the second embodiment of the invention.

Resistors R4a, R4b, and R4c are, as shown in FIG. 8(b), connected in series between the resistors R3 and R5 as shown in FIG. 3 to input electric potentials mu and md developed between the resistors R4a and R4b and between the resistors R4b and R4c to comparators 40 and 41. The comparators 40 and 41 compare the electric potentials mu and md with the main amplifier output of the amplifier 3 to provide signals indicative thereof to a clock 42. The difference between the electric potentials mu and md is determined based on, for example, a required amplitude of the output of the amplifier 3.

The clock 42 may include a pulse generator such as a one-shot multivibrator designed to produce one pulse each time the outputs of the comparators 40 and 41 rise and fall. The pulse from the clock 42 is inputted to a decision circuit 43. The decision circuit 43 counts the number of pulse inputs using a counter not shown. This counter is reset in response to a rising edge (or a trailing edge) of the comparison signal IN0 outputted from the comparator 4.

The decision circuit 43 delivers the clock pulses CLKA from the clock 42 to the shift registers 25 to 36 according to a count value of the counter. For example, when the count value is four (4), no clock pulse is outputted. When the count value shows any one of zero (0) to three (3), the clock pulses CLKA are delivered to the shift registers 25 to 36. The operations of the shift registers 25 to 36 are identical with those in the above first embodiment, and explanation thereof in detail will be omitted here.

The reason that when the clock pulses CLKA are prohibited by the decision circuit 43 from being outputted to the shift registers 25 to 36 when the counter value is four (4), while they are allowed to be outputted when the counter value is any one of zero (0) to three (3) will be described below.

Considering one cycle during which the output of the amplifier 3 rises from a negative peak (i.e., a minimum) to a positive peak (i.e., a maximum) and then falls to a following negative peak when the output of the amplifier 3 is greater than the difference between the electric potentials mu and md, the output of the amplifier 3 exceeds the electric potential md and the electric potential mu in sequence during rising thereof, after which it is lowered below the electric potentials mu and md in sequence during falling thereof. Thus, if the output of the amplifier 3 varies with an amplitude greater than a desired potential difference mu−md, the clock 42 produces four clock pulses during a complete cycle of the output of the amplifier 3 so that the counter of the decision circuit 43 shows a counter value of four (4). Alternatively, if the output of the amplifier 3 varies with an amplitude smaller than the desired potential difference mu−md, the clock 42 produces no clock pulse or any of one to three clock pulses, and the counter of the decision circuit 43 shows any one of zero (0) to three (3). It may, thus, be determined that the output of the amplifier 3 is not varying with an amplitude greater than the desired potential difference mu−md when the decision circuit 43 shows a count value of any one of zero (0) to three (3). The decision circuit 43 delivers the clock pulses CLKA to the shift registers 25 to 36 for increasing the gain of the amplifier 3. No clock pulse may also be outputted from the decision circuit 43 when the count value is three (3).

Figure 9:
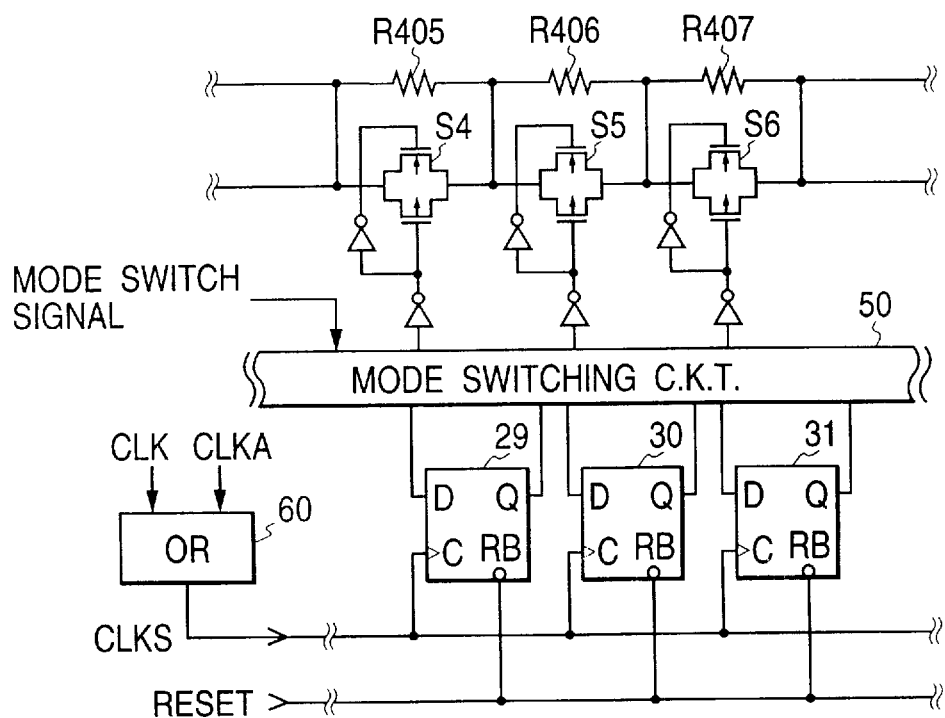
FIG. 9 is a circuit diagram which shows a gain switching circuit according to the third embodiment of the invention.

FIG. 9 shows a sensor signal processing circuit according to the third embodiment of the invention which increases and decreases the gain of the amplifier 3 according to a variation in potential difference of the output of the amplifier 3. In the drawing, three switching circuits S4 to S6 and three shift registers 29 to 31 are illustrated, but in practice twelve switching circuits S1 to S12 and twelve shift registers 25 to 26 are used similar to the one shown in FIG. 2.

The sensor signal processing circuit of this embodiment uses a combination of the automatic gain control circuit shown in FIG. 3 and the circuit shown in FIG. 8(b) and includes a mode switching circuit 50.

The mode switching circuit 50 is connected to the data input terminals D and the output terminals Q of the shift registers 29 to 31 and designed to selectively establish a gain decreasing mode and a gain increasing mode. In the gain decreasing mode, the connection of the output terminal Q of a leading shift register to the data input terminal D of a following shift register is established. Specifically, the output terminals Q of the shift registers 29 and 30 are connected to the data input terminals D of the shift registers 30 and 31, respectively. The switching circuits S5 and S6 are turned on in response to outputs of the shift registers 29 and 30, respectively (the switching circuit S4 is turned on by an output of the shift register 28). In the gain increasing mode, the connection of the output terminal Q of a following shift register to the data input terminal D of a leading shift register is established. Specifically, the output terminals Q of the shift registers 30 and 31 are connected to the data input terminals D of the shift registers 29 and 30, respectively. The switching circuits S4 to S6 are turned on in response to outputs of the shift registers 29 to 31, respectively. The mode switching circuit 50 produces a logical sum (OR) of the output signals Q1 and Q2, as shown in FIGS. 4(e) and 4(g) and establishes the gain decreasing mode when the logical sum is at high level and the gain increasing mode when the logical sum is at low level.

An OR circuit 60 outputs clock pulses CLKS to the clock terminals of the shift registers 29 to 31 in response to either of inputs of the clock pulses CLK and CLKA.

The gain of the amplifier 3 may be set to a middle value in response to input of reset signals to the shift registers 29 to 31 from the power-on reset circuit 6.

While the present invention has been disclosed in terms of the preferred embodiment in order to facilitate a better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

For example, in the above embodiments, the gain adjustment is achieved by comparing the output of the amplifier 3 with the upper and lower limit reference voltages in the circuit shown in FIG. 3 and the electric potentials mu and md in the circuit shown in FIG. 8(b), respectively, but may alternatively be achieved by comparing the difference between a peak voltage (i.e., a maximum) and a bottom voltage (i.e., a minimum) of the output of the amplifier 3 with a given reference value. The detection of the peak and bottom voltages may be accomplished using, for example, a circuit shown in FIGS. 4 and 5 of Japanese Patent First Publication No. 6-300548, disclosure of which is incorporated herein by reference.

The determination of whether the gain of the amplifier 3 should be adjusted or not may be made easily by comparing the potential difference of the output of the amplifier 3 with a reference voltage using the clock 42 and the counter of the decision circuit 43 shown in FIG. 8(b), but it gives rise to the difficulty in designing a circuit for controlling timing with which the gain adjustment is performed.

The automatic gain control circuit of this invention may also be used with an amplifier which amplifies an analog signal outputted from an optical sensor reading bar codes.

What is claimed is:

1. An automatic gain control apparatus for controlling gain of an amplifier amplifying an ac signal comprising:

a resistance circuit including a plurality of resistors connected in series through taps, designed to adjust the gain of the amplifier;

a comparing circuit comparing an output signal of the amplifier with reference upper and lower limit values to provide an upper limit signal when the output signal of the amplifier exceeds the reference upper limit value and a lower limit signal when the output signal exceeds the reference lower limit value;

a gain control determining circuit determining whether said comparing circuit has provided the upper limit signal and the lower limit signal sequentially or not for determining whether the gain of the amplifier is to be changed or not; and a gain controlling circuit selectively short-circuiting the taps on both sides of each of the resistors of said resistance circuit to change a total resistance of said resistance circuit for controlling the gain of the amplifier based on determination of said gain control determining circuit.

2. An automatic gain control apparatus as set forth in claim 1, wherein said gain controlling circuit establishes short-circuits of the taps of the resistors in sequence to change the total resistance of said resistance circuit so that the gain of the amplifier is decreased from a maximum value to a desired value.

3. An automatic gain control apparatus as set forth in claim 1, wherein said gain controlling circuit includes a switching circuit which establishes direct communication between the taps on both sides of each of the resistors of said resistance circuit to short-circuit the taps.

4. An automatic gain control apparatus as set forth in claim 1, wherein said gain controlling circuit establishes short-circuits of the taps of the resistors in sequence to change the total resistance of said resistance circuit so that the gain of the amplifier is increased from a minimum value to a desired value.

* * * * *